United States Patent [19]
Murari et al.

[11] Patent Number: 4,803,472
[45] Date of Patent: Feb. 7, 1989

[54] PHASE SIGNAL DETECTING DEVICE

[75] Inventors: Bruno Murari, Monza; Pietro Menniti, Milan; Fabio Marchió, Gallarate, all of Italy

[73] Assignee: SGS Microelecttronica S.p.A., Catania, Italy

[21] Appl. No.: 939,328

[22] Filed: Dec. 8, 1986

[30] Foreign Application Priority Data

Dec. 10, 1985 [IT] Italy ................... 23150 A/85

[51] Int. Cl.$^4$ .................... H03K 5/00; G08B 21/00
[52] U.S. Cl. .................... 340/658; 328/26; 363/127; 323/237; 307/262; 307/236
[58] Field of Search ............ 328/26, 144; 307/236, 307/351, 350, 260-262, 264, 492, 107, 494; 363/127; 323/237; 340/650, 645, 661

[56] References Cited
U.S. PATENT DOCUMENTS 3,210,727 10/1965 McLaughlin et al. ............ 340/658
4,242,674 12/1980 Wheeler ..................... 340/658
4,559,486 12/1985 Spencer et al. ................ 340/645
4,667,282 5/1987 Peterson ..................... 363/89

FOREIGN PATENT DOCUMENTS 0212850 8/1984 Fed. Rep. of Germany .
0978297 11/1982 U.S.S.R. .
0980233 12/1982 U.S.S.R. .

OTHER PUBLICATIONS

"Application of Operational Amplifiers", Jerald Graeme, 1973, McGraw Hill, pp. 124-125.

Primary Examiner—John S. Heyman
Assistant Examiner—Richard Roseen
Attorney, Agent, or Firm—Guido Modiano; Albert Josif

[57] ABSTRACT

To detect the phase signal, particularly for alternators of motor vehicles, with simple and inexpensive measures, an active rectifier is employed, which supplies at the output a signal with constant polarity (e.g. positive) which can thus be used to verify the correct operation or malfunction of the alternator.

4 Claims, 1 Drawing Sheet

PHASE SIGNAL DETECTING DEVICE

BACKGROUND OF THE INVENTION

The present invention relates to a phase signal detecting device, particularly for alternators of motor vehicles.

As is known, in alternators for motor vehicles it is necessary to monitor the current flowing in each winding of the alternator, which hereinafter will also be referred to as "phase signal", to verify the correct operation of the alternator. More in detail, such monitoring is intended to detect the possible breakage of the belt which makes the alternator rotate or other malfunctions of the alternator itself causing respectively a null phase signal or the phase signal exceeding a preset value. More in detail, each phase signal of the alternator is supplied to a rectifier bridge having a branch composed of two diodes per each phase coil, the phase signal being supplied to the intermediate tap between the two diodes, while a battery is connected to the ends of each branch. Accordingly, on the intermediate tap of each branch of the rectifier bridge there is an approximately square wave since when the phase coil is dispensing current, this intermediate tap reaches a voltage higher than the battery and there is direct voltage on the diode connected at the anode, while when the phase coil is not dispensing current (that is the phase coil is absorbing or taking current) this intermediate tap goes under ground voltage. The square wave, usually taken on only one of the three phase branches, is then processed to evaluate the exact operation of the alternator-rectifier bridge system. For this purpose the square wave is filtered to obtain a continuous signal. Currently, two different systems are employed for filtering the signal which is fed to e.g. a comparator to control whether such continous signal is comprised in a preset range. A first system makes use of an RC filter, which is however rather bulky due to the high value of the capacity necessary at the operating frequency of the alternator (generally 1000 to 3000 Hz according to the speed of the alternator, to the number of poles thereof, and to its type). As a consequence of the dimensions of the filter capacitor, the latter cannot be integrated, so that the overall system is rather bulky. A second filtering system, when a partially or fully integrated circuit is desired, instead makes use of digital components, giving a digital delay by means of counters. However, this solution, too, is disadvantageous due to the significant use of semiconductor area for providing the circuit.

SUMMARY OF THE INVENTION

Therefore, the aim of the present invention is to provide a phase signal detecting device, particularly for alternators of motor vehicles, capable of supplying the signal required to point out the correct operation of the alternator-rectifier bridge system, with simple and compact means.

Within the scope of the above described aim, a particular object of the present invention is to provide a phase signal detecting device which can be easily integrated and has a small area bulk.

Still another object of the present invention is to provide a detection device having small production costs, in any case comparable with the known systems.

The indicated aim, the mentioned objects and others which will become apparent hereinafter are achieved by a phase signal detecting device for alternators, in particular of motor vehicles, of the type comprising at least one phase coil and a rectifier bridge connected thereto and including at least two rectifying elements having an intermediate tap connected to said phase coil and supplying an alternating phase signal having positive and negative components, characterized in that said detecting device comprises rectifying means connected at the input to said intermediate tap for rectifying said phase signal and generating a rectified output signal with constant polarity.

In practice, the invention arises from the appreciation that the phase signal has a negative component which can be used to obtain in output a signal with a constant polarity without using filters.

BRIEF DESCRIPTION OF THE DRAWINGS

Further characteristics and advantages of the invention will become apparent from the description of a preferred, but not exclusive, embodiment, illustrated by way of nonlimitative example in the accompanying drawings, where.

DESCRIPTION OF THE PREFERRED EMBODIMENTS

Figure 1:
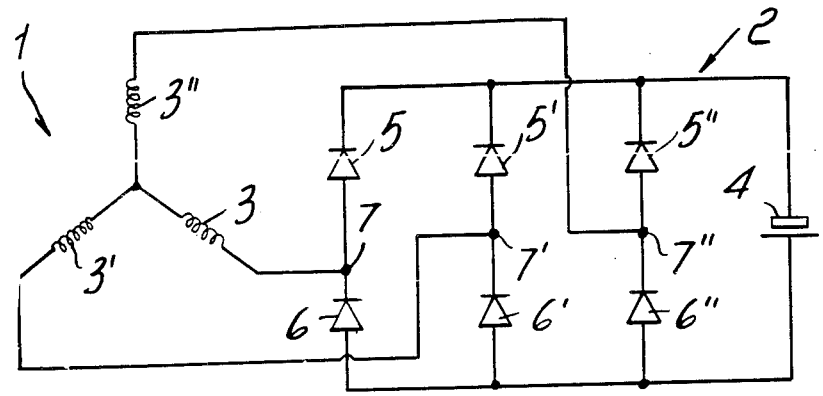
FIG. 1 is a schematic circuit diagram of the alternator-rectifier bridge system currently in use.
Figure 2:
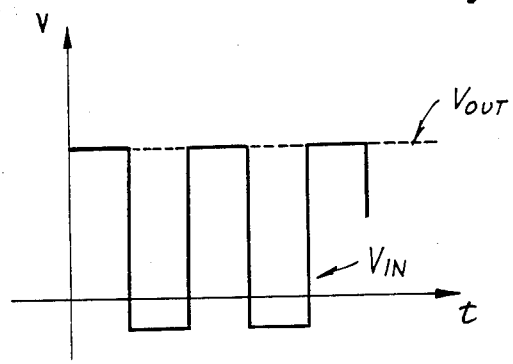
FIG. 2 is the variation of the phase signal, used for monitoring the alternator, with the time.

With reference to FIG. 1, it illustrates schematically the circuit for obtaining the phase signal to be monitored. In said figure, the alternator is indicated with the reference numeral 1, while the rectifier bridge connected thereto is indicated with the reference numeral 2. In detail, the alternator 1 comprises three coils 3, 3' and 3" respectively connected at 7, 7' and 7" with three branches of the rectifier 2 each composed of a pair of upper diodes 5, 5' and 5" and lower diodes 6, 6' and 6', respectiviely. The rectifier furthermore comprises a battery 4 arranged between the anode of the diodes 6, 6', 6" and the cathode of the diodes 5, 5', 5'. The voltage $V_{IN}$ present in the intermediate taps 7, 7' and 7" of the branches of the rectifier is illustrated in FIG. 2. As can be seen, this voltage has a positive component or half-wave and a negative component or half-wave having an absolute value which is smaller than that of the positive component. The invention thus makes use of exactly this negative component, rectifying it so as to obtain at the output a signal with constant polarity (e.g. an all-positive signal) which can be employed to signal the operating status of the alernator, e.g. to switch on a warning light or the like by controlling whether the constant signal is lower than a preset minimum threshold or, possibly, whether it exceeds a preset upper threshold value. In the embodiment illustrated, in particular, the negative half-wave is amplified, differently from the positive one, so as to obtain a practically continuous signal $V_{OUT}$.

Figure 3:
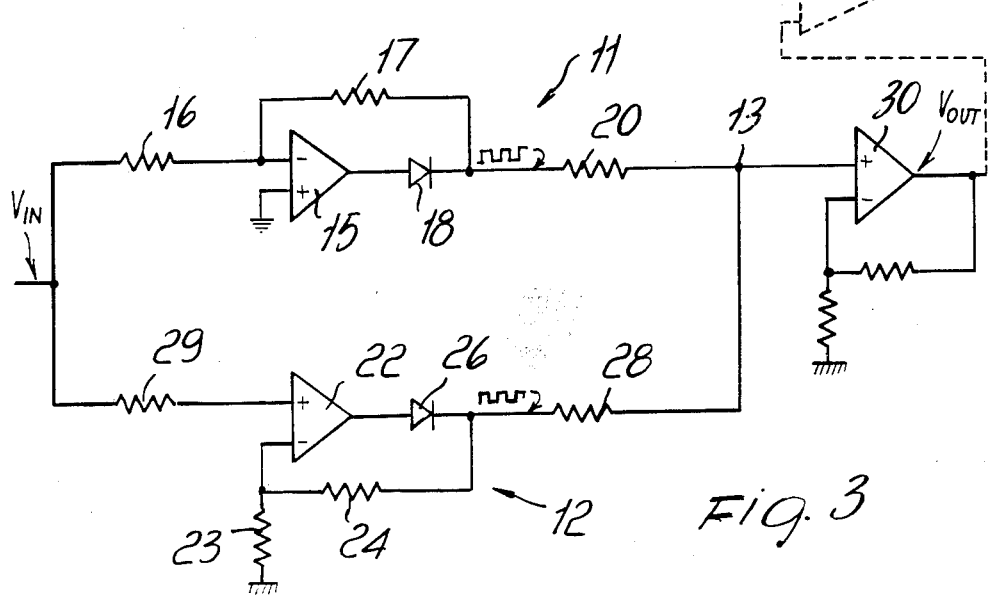
FIG. 3 is a schematic circuit diagram of the embodiment of the device according to the invention.

For this purpose, the detection device according to FIG. 3 comprises a first rectifying amplifier 11 for the negative half-wave and a second rectifying amplifier 12 for the positive half-wave, arranged in parallel with respect to each other so that the respective output signals are added at the adder node 13. In detail, the amplifier branch for the negative component comprises an operational amplifier 15 in the inverting configuration having a non-inverting input connected to the ground and an inverting input fed with the phase signal $V_{IN}$ taken at tap 7, 7' or 7'. The amplifier stage 11 comprises furthermore the resistors 16 and 17 the ratio of which gives the gain of this stage as per se known. The stage furthermore comprises a diode 18 connected with its anode to the output of the operational amplifier 15 and with the cathode to the resistor 17, so as to cut away the negative component at the output of amplifier 15. The stage is completed by the resistor 20.

The stage 12 in turn comprises an operational amplifier 22 in the non-inverting configuration on the non-inverting input of which, by means of the resitor 29, the phase signal to be rectified is supplied, while its inverting input is connected to the ground and with the output through resistors 23 and 24 which determine the gain thereof. Furthermore, this stage 12 also comprises a rectifying diode 26 and an adder resistor 28. The circuit is completed by an adder amplifier 30.

The circuit illustrated in FIG. 3 operates as follows. When the alternator-rectifier bridge system 1-2 is operating correctly, the signal shown in FIG. 2 is fed on the input of the two amplifiers 15 and 22. When the negative half-wave is present on the inverting input of the amplifier 15, this supplied at the output a positive signal which is proportional to the ratio between the resistors 16 and 17. This signal, since it is positive, is not blocked by the diode 18 and is supplied to the adder node 13. Simultaneously, the same negative half-wave is furthermore supplied on the non-inverting input of the amplifier 22 which thus supplies at the output a negative signal which is blocked by the diode 26. Accordingly, on the node 13 there is only the signal originating from the amplifier 15 corresponding to the negative half-wave, which has been inverted and amplified. On the contrary, during the positive half-wave, the inverting input of the amplifier 15 is higher than the ground and therefore the output of this amplifier is negative and is blocked by the diode 18. Conversely, the amplifier 22 supplies at the output a positive signal which is fed directly to the node 13 since now the diode 26 is conducting. Accordingly, on the node 13 there will be a signal with a value proportional to the output of the amplifier 22. Naturally, by suitably adjusting the values of the resistors 16 adn 17, 23 and 24, that is by suitably setting the gains of the amplifier stages 11, 12, so that they inversely match the positive and negative components of the input signals, it is possible to obtain on the node 13 signals supplied alternately by the stage 11 or by the stage 12, but with an equal value. As an example, if, as is usual, the positive half-wave is equal to 15 V, while the negative one is equal to $-1$ V, it is possible to adjust the resistors 16 and 17 so that the stage 11 has an inverting gain equal to 15, while the stage 12 has a gain equal to 1. Or the stage 11 can have a smaller gain, while the stage 12 has a gain smaller than 1. The practically continuous signal obtained on the node 13 is thus fed to the amplifier-addder 30, which can be composed of, e.g., a comparator. Thus this signal $V_{OUT}$ may be fed to comparing means 31, also receiving a reference threshold signal $V_{REF}$, or the amplifier 30 may define itself the comparing means to point out any possible malfunction. The circuit of FIG. 3 can be completed, if desired, by a filter to eliminate possible peaks or spikes in voltage due, e.g., to the not-perfect verticality of the falling and rising fronts of the phase signal. However, since these peaks are very brief, a filter having a value such as to be easily integrated is sufficient.

As can be seen from the above description, the invention fully achieves the intended aims. Indeed, a very simple phase signal detector has been provided, which can be easily integrated and gives the signal necessary for subsequent processing.

The invention thus conceived is susceptible to a number of modifications and variations, all of which are within the scope of the inventive concept.

In particular, the fact is stressed that, though the example described provides a differential amplification of the two fhalf-waves, so as to obtain an approximately continuous signal, the invention is not limited to this embodiment, but comprises all the embodiments in which the phase signal is rectified so as to obtain a signal with a constant polarity (positive or negative) which can be employed for monitoring the operation of the alternator.

Furthermore, all the details may be replaced by other technically equivalent ones.

We claim:

1. In an alternator, in particular for motor vehicles, comprising at least one phase coil, a rectifier bridge including at least two rectifying elements connected in series to each other and defining two opposite terminals and an intermediate tap, and a voltage source connected between said two opposite terminals, said intermediate tap being connected to said phase coil and supplying an alternating substantially rectangular phase signal having positive and negative components, a phase signal detecting device including active rectifying means having an input connected to said intermediate tap for rectifying said phase signal and generating a rectified output signal with constant polarity, said active rectifying means comprising:

first amplifier means and second inverting amplifier means mutually arranged in parallel, with said first and second amplifier means having respective amplifier means inputs connected together and to said intermediate tap and respective amplifier means outputs connected together, said first and second amplifier means alternately and selectively amplifying each one of said positive and negative components of said phase signal and alternately generating amplifier means output signals of a same polarity, and adder means having an adder means input connected to said amplifier means outputs, said adder means alternately receiving said amplifier means output signals and generating said rectified output signal.

2. A device according to claim 1, wherein said first amplifier means comprises a first operational amplifier in a noniverting configuration and said second inverting amplifier means comprises a second operational amplifier in an inverting configuration.

3. A device according to claim 1, further comprising first and second rectifying diodes connected each at a respective output of said amplifier means for alternately conducting and supplying said amplifier means output signals to said adder means.

4. A device according to claim 1, wherein said first and said second amplifier means have each a different gain inversely matching said positive and negative components of said phase signal for alternately generating said amplifier means output signals having substantially rectangular pulses with a same polarity and substantially same amplitudes, and said adder means generating an approximately continuous signal.

* * * * *